United States Patent [19]

Morrish et al.

[11] Patent Number: 5,374,414
[45] Date of Patent: Dec. 20, 1994

[54] SELF-SUPPORTING DIAMOND FILAMENTS

[75] Inventors: Arthur A. Morrish, LaPlata; Paul M. Natishan, Annapolis, both of Md.; Benji Maruyama; Pehr E. Pehrsson, both of Alexandria, Va.

[73] Assignee: The United States of America as represented by the Secretary of the Navy, Washington, D.C.

[21] Appl. No.: 710,860

[22] Filed: Jun. 6, 1991

Related U.S. Application Data

[63] Continuation-in-part of Ser. No. 698,218, May 10, 1991.

[51] Int. Cl.$^5$ ............................................. C01B 31/06
[52] U.S. Cl. ........................................................ 423/446
[58] Field of Search ............................................ 423/446

[56] References Cited

U.S. PATENT DOCUMENTS

| | | | |
|---|---|---|---|
| 4,294,871 | 10/1981 | Hieber et al. | 427/237 |
| 4,783,368 | 11/1988 | Yamamoto et al. | 428/408 |
| 4,816,286 | 3/1989 | Hirose | 423/446 |
| 4,859,493 | 8/1989 | Lemelson | 427/45.1 |
| 4,938,940 | 7/1990 | Hirose et al. | 423/446 |
| 4,960,643 | 10/1990 | Lemelson | 428/408 |
| 5,006,203 | 4/1991 | Purdes | 423/446 |
| 5,011,509 | 4/1991 | Frushour | 51/295 |
| 5,071,677 | 12/1991 | Patterson et al. | 427/423 |
| 5,075,094 | 12/1991 | Morrish et al. | 423/446 |
| 5,080,975 | 1/1992 | Komki et al. | 423/446 |
| 5,096,736 | 3/1992 | Anthony et al. | 423/446 |

*Primary Examiner*—Gary P. Straub
*Assistant Examiner*—Stuart L. Hendrickson
*Attorney, Agent, or Firm*—Thomas E. McDonnell; Barry A. Edelberg

[57] ABSTRACT

Filamentous substrates are coated with diamond by a chemical vapor deposition process. The substrate may then be etched away to form a diamond filament. In a preferred embodiment, the substrate is copper-coated graphite. The copper initially passivates the graphite, permitting diamond nucleation thereon. As deposition continues, the copper-coated graphite is etched away by the active hydrogen used in the deposition process. As a result a substrateless diamond tubule is formed. Diamond-coated and diamond filaments are useful as reinforcement materials for composites, as filtration media in chemical and purification processes, in biomedical applications as probes and medicinal dispensers, and in such esoteric areas as chaff media for jamming RF frequencies.

4 Claims, 3 Drawing Sheets

FIG. 1(a)
FIG. 1(b)
FIG. 1(c)

SELF-SUPPORTING DIAMOND FILAMENTS

CROSS-REFERENCE TO RELATED APPLICATIONS

This application is a continuation-in-part of United States patent application, entitled DIAMOND-REINFORCED MATRIX COMPOSITES, to Natishan et al., filed May 10, 1991, U.S. Ser. No. 07/698,218.

BACKGROUND OF THE INVENTION

1. Field of the Invention

The present invention relates to the production and use of filaments and use of diamond-coated or diamond filaments, such as fibers, tubes and whiskers.

2. Description of the Prior Art

Small diameter tubes are utilized in many areas of both commerce and research. They are found in biomedical applications as probes and medicinal dispensers, as filtration media in chemical and purification processes, and in such esoteric areas as chaff media for jamming RF frequencies. As described in the parent, copending United States patent application, entitled DIAMOND-REINFORCED MATRIX COMPOSITES, to Natishan et al., filed May 10, 1991, U.S. Ser. No. 07/698,218, the entirety of which is incorporated herein by reference, diamond and diamond-coated filaments, including diamond and diamond-coated fibers, tubes and whiskers are also useful as reinforcement materials for composites, including, but not limited to thermal management materials. In all of these areas, research continues in an effort to develop tubules or fibers with enhanced properties (increased hardness, lower chemical reactivity, increased thermal conductivity, etc.).

Diamond is inert in a variety of environments including inorganic acids, bases and organic solvents, including solutions such as hot aqua-regia ($\frac{2}{3}$ HCl and $\frac{1}{3}$ HNO$_3$), hot aqua-fortis ($\frac{2}{3}$ H$_2$SO$_4$ and $\frac{1}{3}$ HNO$_3$)and hot caustic solutions (KOH). Additionally, diamond has a very high thermal conductivity (a factor of 5 greater than copper), it is an electrical insulator which can be doped to become a semi-conductor, it has an excellent resistance to wear, and it has a frictional co-efficient similar to that of Teflon ™. These materials properties provide many opportunities for use in the areas described above.

SUMMARY OF THE INVENTION

Accordingly, it is an object of this invention to make diamond and diamond-coated filaments.

It is another object of the present invention to make diamond and diamond-coated filaments with useful thermal, electrical and mechanical properties.

It is a further object of the present invention to make diamond and diamond-coated filaments by a process which permits great variation of the ratio of core to diamond diameter.

It is yet another object of the present invention to make diamond tubules.

These and additional objects of the invention are accomplished by coating filamentous substrates with diamond by a chemical vapor deposition process. If desired, the substrate may then be etched or dissolved to convert the diamond-coated filament into a diamond filament.

BRIEF DESCRIPTION OF THE DRAWINGS

A more complete appreciation of the invention will be readily obtained by reference to the following Description of the Preferred Embodiments and the accompanying drawings in which like numerals in different figures represent the same structures or elements, wherein:

Figs. 1a through 1d are scanning electron micrographs showing a tubule that was produced in accordance with the present invention.

DETAILED DESCRIPTION OF THE PREFERRED EMBODIMENTS

Figure 1D:

Generally, diamond or diamond-coated filaments made according to this invention are tubes (hollow), fibers or whiskers having a substantially greater length than diameter, and having a cross-sectional thickness of about 5 to about 200 $\mu$m, and typically about 100 $\mu$m to about 200 $\mu$m. The terms "filament" and "fiber", "tube" and "whisker", as used herein, are intended to encompass, in addition to forms having the traditional round cross-section, forms having other than the traditional round cross-section, such as star-shaped, square, hexagonal, octagonal, etc. In this specification and the claims that follow, the term "filament" is generic and encompasses tubes, fibers, and whiskers; the terms "fiber" and "whisker" refer to non-hollow (i.e., solid) structures; and the term "tube" refers to a hollow structure which may have the dimensional characteristics of either fibers or whiskers. Fibers are short in two dimensions and essentially continuous in one dimension. Whiskers are short in two dimensions, and of relatively small length. The diamond coating on the fibers is in the form of a sheath which completely or partially encompasses the substrate, or, if it lacks a substrate, is self-supporting.

Diamond tubes have been created using a hot filament assisted chemical vapor deposition (FACVD) method. Due to the way in which the tubes are produced, there is no inherent reason why the tubes cannot be made such that the wall thickness can be varied from a very small fraction of the total diameter to a fraction approaching unity which will essentially produce a fiber.

The diamond or diamond-coated filaments of this invention are made by depositing diamond on an appropriate filamentous substrate by chemical vapor deposition and then optionally removing the substrate. Chemical vapor deposition is typically performed according to the process described by Morrish et al. in U.S. Ser. No. 07/516,585, filed Apr. 30, 1990 now U.S. Pat. No. 5,075,094, the entirety of which is incorporated herein by reference. For example, the surface of substrate filaments may be scratched with diamond and coated with oil prior to depositing diamond thereon by fiber assisted chemical vapor deposition (FACVD). While preferable for high nucleation, scratching and oil-coating of substrate filaments are not absolutely required for the process according to the present invention. If the substrate filaments are to be prepared for deposition by scratching, scratching may be done by any method. One possible method scratches the substrate filaments by placing them in an ultrasonic cleaner containing diamond grit.

The filamentous substrate upon which the diamond is grown may be any material, such as Cu, W, SiC, quartz, graphitic carbon and Cu-coated graphite, suitable as a substrate for FACVD deposition of diamond thereon, which can be fabricated as a filament. Materials suitable as substrates for the FACVD deposition of diamond typically can withstand a predominantly hydrogen atmosphere at $\sim 600°-1000°$ C., preferably $\sim 800°-1000°$ C., for a sufficient time to permit diamond nucleation and growth thereon. If diamond tubes or completely diamond filaments are to be made, the substrate filament should be of a material which may be easily removed without damaging the diamond deposited thereon. For example, copper provides an excellent substrate for the preparation of diamond tubes, since, after diamond deposition, the copper may be dissolved in a strong acid.

In principle diamond filaments can be produced by this method on any diameter filament. The major constraint on the wire is that its radius of curvature should be such that sufficient diamond particles can fit around it to form a tube. The crystal size of the diamond particles can be controlled to sub-micron levels. Within these constraints, diamond tubes can be formed which will range from those where the wall thickness is a very small fraction of the diameter and the void is large, to those where the void is a very small fraction of the diameter and the tube essentially becomes a fiber. Tubes have been produced to date where the walls are very small fractions of the total diameter: wall thickness=-2-5 $\mu$m, void $\sim 130$ $\mu$m and length of up to one inch.

Diamond filaments can also be produced by growing on a graphite fiber and then etching the graphite away. The graphite, which normally would be immediately etched away by the atomic hydrogen, is passivated by a passivating material, for example a metal such as copper, long enough for diamonds to nucleate on the surface of the fiber. It is possible to grow filaments and tubes of arbitrary length by controlling the degree to which the tube is allowed to form before etching the graphite core away. Further growth will then thicken and/or fill in the partial tubes or fibers. By this method, a completely diamond, non-hollow (i.e., solid) filament may be produced.

If desired, the diamond-coated or diamond filament may be doped by including a dopant, such as $B_2O_3$, $P_2O_5$, etc., in the feed gas. The amount of dopant incorporated into the diamond will depend upon the concentration of dopant in the feed gas.

Having described the invention, the following examples are given to illustrate specific applications of the invention including the best mode now known to perform the invention. These specific examples are not intended to limit the scope of the invention described in this application. For example, other methods of diamond deposition by chemical vapor deposition, such as the use of an RF plasma torch, may be used in conjunction with the present invention.

EXAMPLES

Example 1

Production of diamond tube by FACVD of diamond on copper followed by chemical etching Diamond tubes were produced in a filament assisted chemical vapor deposition, FACVD, reactor by passing hydrogen and methane gases over a hot filament. The diamond tubes were grown on wires that were placed in the deposition system. This discussion will concentrate on tubes grown on copper wires but any material which could withstand a predominantly hydrogen atmosphere at $\sim 600°-1000°$ C., typically between $\sim 800°$ and $1000°$ C., for a sufficient time to permit diamond nucleation and growth thereon, would be suitable. Copper wires were scratched by placing them in an ultrasonic cleaner with a slurry of 0.1 mm diamond particles for $\sim 15$ minutes. The wires were then coated with a hydrocarbon oil (hydrocarbon vacuum pump oil, specifically HE-175 Leybold vacuum pump oil), using a cotton swab dipped in oil and applying sufficient oil to saturate the wire surfaces, to enhance growth. The wires were placed in the deposition chamber and the diamond was grown under the following conditions: Pressure=40 torr, filament temperature=$2100°-2200°$ C., substrate temperature=$850°\pm 50°$ C., gas flow=100 SCCM $H_2$/1.01 SCCM $CH_4$ and deposition time of approximately 4 hours. The result was series of copper wires coated with diamond. The copper was then chemically removed using a solution of concentrated nitric acid which left the diamond sheath (tube) undamaged.

FIGS. 1a through 1d are a series of scanning electron micrographs increasing in magnification of a tubule in an end-on orientation. The tubule had an inner diameter of approximately 100 $\mu$m and a wall thickness of approximately 2 $\mu$m. The length of this tubule was approximately 3 cm. The tubule was formed by first depositing diamond onto a 100 $\mu$m diameter copper wire whose surface was properly prepared, followed by dissolving the copper wire in concentrated nitric acid. The micrographs illustrate the following observations: The cross-section of the fiber was uniformly circular, conforming to the original shape of the copper wire. The wall thickness is uniform around the circumference and down the length of the tubule—the gap in the tubule is breakage due to excessive tweezer force.

Figure 2A:
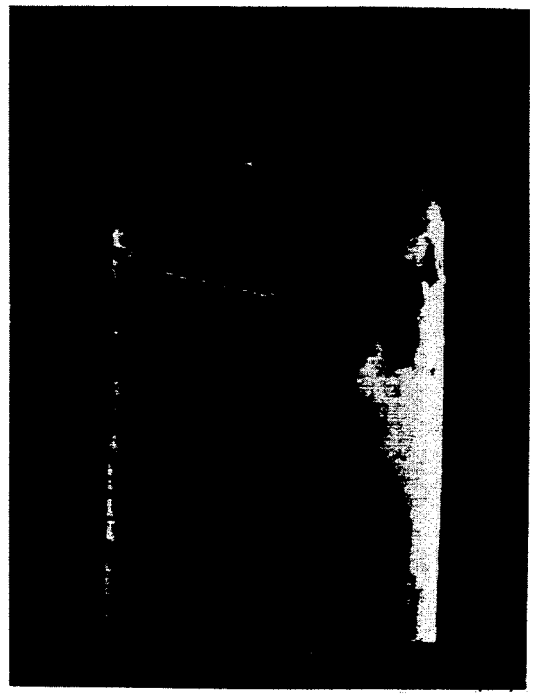
FIGS. 2a through 2c are micrographs taken of the tubule surfaces normal to the tubule long axis.
Figure 2B:
Figure 2C:

FIGS. 2a through 2c are micrographs taken of the tubule surfaces normal to the tubule long axis. FIG. 2a shows both the inner and outer surfaces of the tubule. It shows the uniformity of diameter along the length of the tubule. FIG. 2b shows the outer surface of the tubule. Although somewhat rougher than the inside face of the tubule, it in still fairly uniform. FIG. 2c shows the inner surface of the tubule. It was extremely smooth and uniform. FIGS. 2a through 2c demonstrate the tubules were free of pores and holes and are uniform.

Example 2

Growth of diamond on graphite filaments overcoated with copper

Figure 3B:
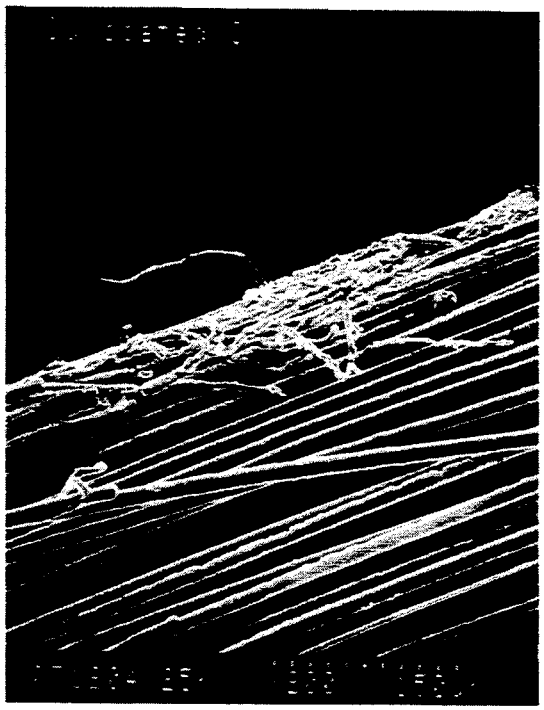
FIGS. 3a through 3d are micrographs of diamond tubules formed by depositing diamond on coppercoated graphite fibers while simultaneously etching the graphite away.
Figure 3A:
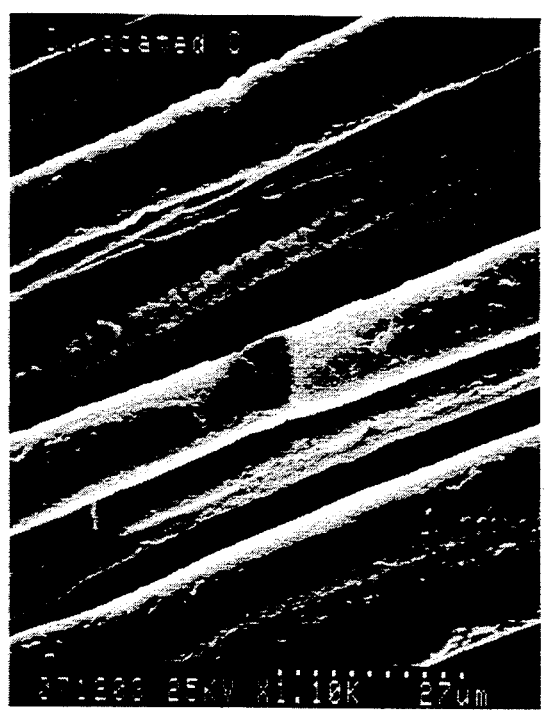
Figure 3C:
Figure 3D:

Deposition of diamond was carried out as described above for the copper samples, except that no chemical etch was employed. FIGS. 3a through 3d are micrographs of diamond tubules formed by depositing diamond on copper-coated graphite fibers while simultaneously etching the graphite away. In this process, as the diamond is deposited on the properly prepared surfaces of the copper-coated graphite, the hydrogen simultaneously etches the graphite away, leaving a tubule of diamond with an inner copper coating, which copper coating is also quickly etched away by further active hydrogen, leaving simply a tubule of diamond. In FIGS. 3a and 3b the coatings are uniform and continuous, indicating that the diamond has successfully deposited onto the entire surface. FIGS. 3c and 3d are micrographs of incompletely formed fibers. The hollow core is observable through gaps along the length of the fibers.

The advantage of diamond tubule growth via the two-step copper wire technique for growing tubules is the increase in uniformity and lack of pores. The advantage of the diamond tubule formed by deposition onto copper-coated graphite is that the tubule is formed in one step, i.e. by simultaneous deposition and etching.

Obviously, many modifications and variations of the present invention are possible in light of the above teachings. It is therefore to be understood that, within the scope of the appended claims, the invention may be practiced otherwise than as specifically described.

What is claimed is:

1. A substrate-less, self-supporting tube consisting essentially of diamond and having an outer diameter of about 5 $\mu$m to about 200 $\mu$m, said tube being of essentially uniform outer diameter.

2. A solid, self-supporting, substrate-less non-hollow filament consisting essentially of diamond and having a outer diameter of about 5 $\mu$m to about 200 $\mu$m, said filament being of essentially uniform outer diameter.

3. The tube of claim 1, said diamond tube having an essentially smooth inner surface.

4. A tube according to claims 1 which is essentially free of pores and holes.

* * * * *